(12) United States Patent
Fujimori

(10) Patent No.: US 10,440,243 B2
(45) Date of Patent: Oct. 8, 2019

(54) IMAGE PICKUP APPARATUS

(71) Applicant: OLYMPUS CORPORATION, Tokyo (JP)

(72) Inventor: Noriyuki Fujimori, Suwa (JP)

(73) Assignee: Olympus Corporation, Tokyo (JP)

( * ) Notice: Subject to any disclaimer, the term of this patent is extended or adjusted under 35 U.S.C. 154(b) by 0 days.

(21) Appl. No.: 15/783,433

(22) Filed: Oct. 13, 2017

(65) Prior Publication Data

US 2018/0041670 A1 Feb. 8, 2018

Related U.S. Application Data

(63) Continuation of application No. PCT/JP2015/061867, filed on Apr. 17, 2015.

(51) Int. Cl.
H04N 5/225 (2006.01)
G02B 23/24 (2006.01)
(Continued)

(52) U.S. Cl.
CPC ........... *H04N 5/2253* (2013.01); *G02B 23/24* (2013.01); *G02B 23/2484* (2013.01);
(Continued)

(58) Field of Classification Search
CPC ......... H04N 5/2253; H04N 2005/2255; H05K 2201/10446; H05K 1/0209; H05K 2201/09027; H05K 2201/09045; H05K 3/3405; H05K 1/0203; H05K 1/181; H05K 2201/10151; H05K 2201/10121;
(Continued)

(56) References Cited

U.S. PATENT DOCUMENTS 8,404,516 B2 * 3/2013 Bauer ................... B81B 7/0058
438/108
2005/0154294 A1 7/2005 Uchiyama et al.
2011/0199473 A1 8/2011 Kojima

FOREIGN PATENT DOCUMENTS

EP 1681010 A1 7/2006
JP 2000199863 A 7/2000
(Continued)

OTHER PUBLICATIONS

Machine Translation of JP 2014-110847 (Year: 2014).*
(Continued)

*Primary Examiner* — Twyler L Haskins
*Assistant Examiner* — Angel L Garces-Rivera
(74) *Attorney, Agent, or Firm* — Scully Scott Murphy & Presser, P.C.

(57) ABSTRACT

An image pickup apparatus includes: an image pickup device including a plurality of convex electrodes disposed on an opposing surface; and a wiring board including a plurality of first edge electrodes on a first main surface and a plurality of second edge electrodes on a second main surface, wherein the wiring board is disposed in an upright state on the opposing surface, the plurality of convex electrodes include first convex electrodes and second convex electrodes, the first convex electrodes are bonded to the first edge electrodes, the second convex electrodes are bonded to the second edge electrodes, and the wiring board is held between the first convex electrodes and the second convex electrodes.

6 Claims, 6 Drawing Sheets

(51) Int. Cl.
*H01L 27/14* (2006.01)
*H01L 27/146* (2006.01)
*H05K 1/02* (2006.01)
*H05K 1/18* (2006.01)
*H05K 3/34* (2006.01)

(52) U.S. Cl.
CPC ........ *H01L 27/14* (2013.01); *H01L 27/14636* (2013.01); *H05K 1/0203* (2013.01); *H05K 1/181* (2013.01); *H05K 3/3405* (2013.01); H01L 27/14618 (2013.01); H04N 2005/2255 (2013.01); H05K 1/0209 (2013.01); H05K 2201/09027 (2013.01); H05K 2201/09045 (2013.01); H05K 2201/10121 (2013.01); H05K 2201/10151 (2013.01); H05K 2201/10446 (2013.01)

(58) Field of Classification Search
CPC ............... H01L 27/14636; H01L 27/14; H01L 27/14618; G02B 23/2484; G02B 23/24
See application file for complete search history.

(56) References Cited

FOREIGN PATENT DOCUMENTS

| | | | |
|---|---|---|---|
| JP | 2005130943 A | 5/2005 |
| JP | 2007036481 A | 2/2007 |
| JP | 2011166080 A | 8/2011 |
| JP | 2013197501 A | 9/2013 |
| JP | 2014-000208 A | 1/2014 |
| JP | 2014094237 A | 5/2014 |
| JP | 2014110847 A | 6/2014 |
| JP | 2014133046 A | 7/2014 |
| WO | 2005039400 A1 | 5/2005 |
| WO | 2014065099 A1 | 5/2014 |
| WO | 2014109094 A1 | 7/2014 |

OTHER PUBLICATIONS

Machine Translation of JP 2014-094237 (Year: 2014).*
International Search Report dated Jun. 23, 2015 issued in PCT/JP2015/061867.

* cited by examiner

IMAGE PICKUP APPARATUS

CROSS REFERENCE TO RELATED APPLICATION

This application is a continuation application of PCT/JP2015/061867 filed on Apr. 17, 2015, the entire contents of which are incorporated herein by this reference.

BACKGROUND OF THE INVENTION

1. Field of the Invention

The present invention relates to an image pickup apparatus including: an image pickup device including convex electrodes on an opposing surface facing a light receiving surface; and a wiring board including edge electrodes bonded to the convex electrodes.

2. Description of the Related Art

A CSP (chip size package) type image pickup apparatus with a size in plan view substantially equivalent to a size in plan view of an image pickup device is small, and particularly, the diameter is small. Therefore, the CSP type image pickup apparatus is used in a distal end portion of an electronic endoscope.

As shown in FIG. 1, Japanese Patent Application Laid-Open Publication No. 2000-199863 discloses an image pickup apparatus 101 including an image pickup device 130, a pattern film 150, a wiring board 140, and a signal cable 160. Electrodes 132 are disposed on a light receiving surface provided with a light receiving section 131 of the image pickup device 130. The electrodes 132 are electrically connected to the wiring board 140 through the flexible pattern film 150. The signal cable 160 is bonded to electrodes 146 behind the wiring board 140 provided with electronic components 145.

As shown in FIG. 2, the wiring board 140 is made of a T-shaped multilayer ceramic plate including a vertical substrate 140A and a horizontal substrate 140B orthogonal to the substrate 140A. The pattern film 150 is bonded to the vertical substrate 140A and electrically connected to bonding pads 141. The horizontal substrate 140B is adhered such that bonding pads 142 are adjacent to the bonding pads 141. It is disclosed that bond strength of the substrate 140A and the substrate 140B can be improved by using a solder 143 across the bonding pads 141 and the bonding pads 142.

SUMMARY OF THE INVENTION

An embodiment of the present invention provides an image pickup apparatus including: an image pickup device including: a light receiving section configured to receive light entering from a light receiving surface; and a plurality of convex electrodes disposed on an opposing surface that faces the light receiving surface; and a wiring board including a plurality of first edge electrodes on a first main surface and a plurality of second edge electrodes on a second main surface, wherein the wiring board is disposed in an upright state on the opposing surface of the image pickup device, the plurality of convex electrodes include first convex electrodes and second convex electrodes, the first convex electrodes are bonded to the first edge electrodes, the second convex electrodes are bonded to the second edge electrodes, and the wiring board is held between the first convex electrodes and the second convex electrodes.

DETAILED DESCRIPTION OF THE PREFERRED EMBODIMENT(S)

Embodiment

Figure 1:
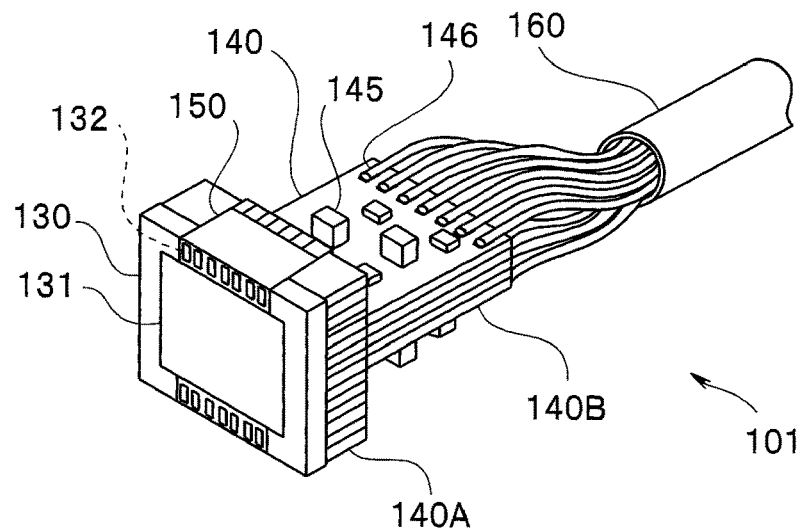
FIG. 1 is a perspective view of a conventional image pickup apparatus.
Figure 2:
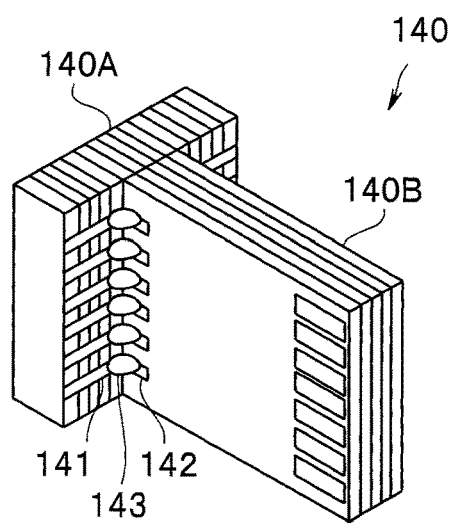
FIG. 2 is a perspective view of a wiring board of the conventional image pickup apparatus.
Figure 3:
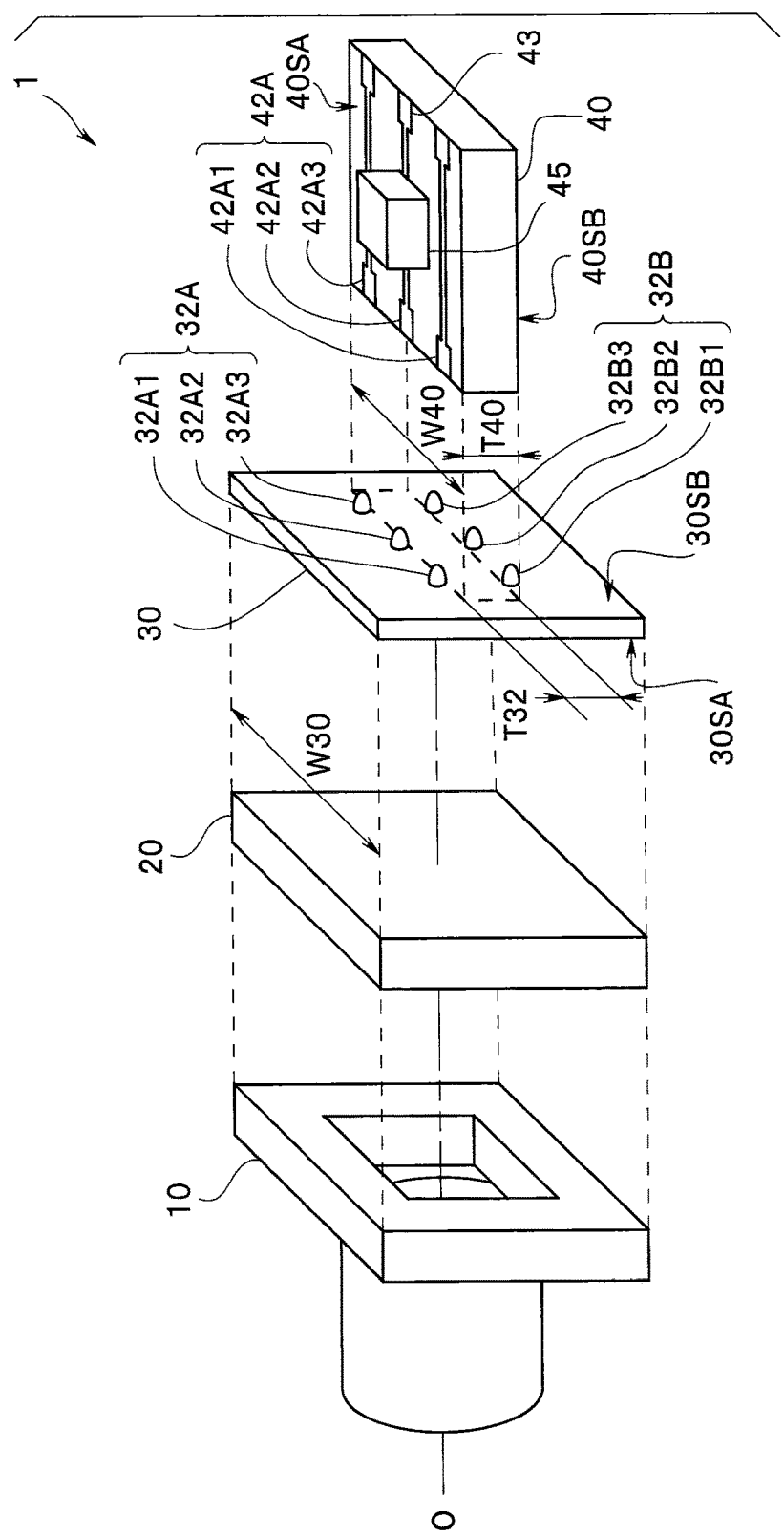
FIG. 3 is an exploded view of an image pickup apparatus according to an embodiment.
Figure 4:
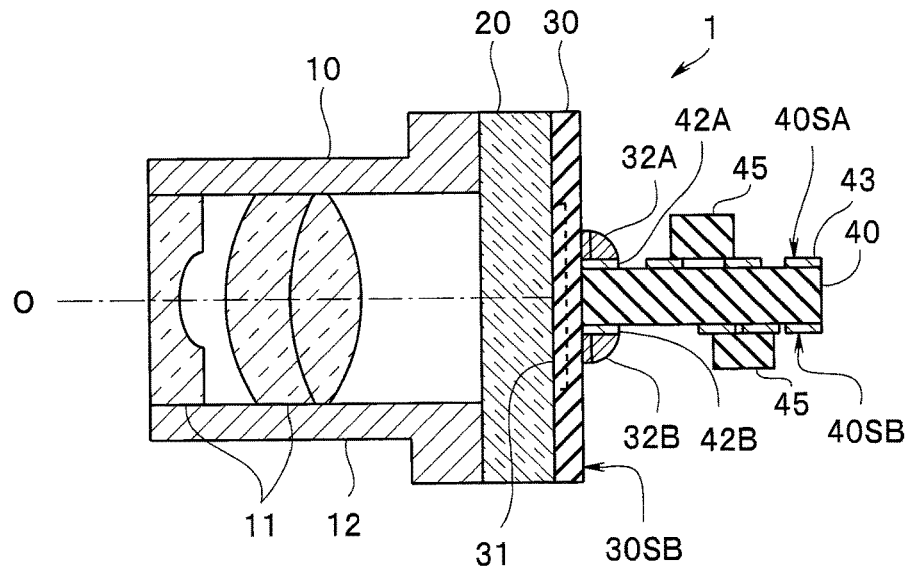
FIG. 4 is a cross-sectional view of the image pickup apparatus according to the embodiment.

As shown in FIGS. 3 and 4, an image pickup apparatus 1 according to an embodiment of the present invention includes an image pickup device 30 and a wiring board 40 as basic constituent elements. Note that in the following description, drawings based on respective embodiments are schematic drawings, and a relationship between thickness and width of each part, a ratio of thickness and a relative angle of respective parts, and the like are different from the reality. The relationship or the ratio of dimensions between the drawings may be different in some parts of the drawings.

The image pickup device 30 constituted by a semiconductor made of silicon or the like includes: a light receiving section 31 configured to receive light entering from a light receiving surface 30SA; and a plurality of convex electrodes 32 disposed on an opposing surface 30SB facing the light receiving surface 30SA and connected to the light receiving section 31. Note that the surroundings of the convex electrodes 32 provided with wiring and the like (not shown) are insulated and sealed by insulating/sealing thin films (not shown) made of silicon oxide, silicon nitride, a resin, or the like. The image pickup device 30 may be front-side illumination (FSI) or may be back-side illumination (BSI).

The plurality of convex electrodes 32 include first convex electrodes 32A (32A1 to 32A3) and second convex electrodes 32B (32B1 to 32B3). Note that one character at the end of reference sign will be omitted in some cases to refer to each of a plurality of constituent elements with a same function. For example, each of the first convex electrodes 32A1 to 32A3 will be referred to as 32A, and each of the convex electrodes 32A and 32B will be referred to as convex electrodes 32.

In the image pickup apparatus 1, a distance T32 between the first convex electrode 32A and the second convex electrode 32B, such as a distance T32 between the first convex electrode 32A1 and the second convex electrode 32B1, is substantially the same as a thickness T40 of the wiring board 40.

Note that a cover member 20 is adhered to the light receiving surface 30SA of the CSP-type image pickup device 30 to protect the light receiving section 31 in a manufacturing process. The cover member 20 protects the image pickup device 30 without inhibiting the light reception of the light receiving section 31. The cover member 20 is made of a light-transmitting member such as a light-transmitting glass or resin.

An optical system 10 is further disposed on the cover member 20. The optical system 10 includes: a lens 11 configured to condense light from an object on the light receiving section 31; and a frame member 12 configured to hold the lens 11. The lens 11 condenses the light from the object and forms an image on the light receiving section 31. Note that the lens 11 included in the optical system 10 may be a single lens or may be a combination of a plurality of lenses. In addition, the cover member 20 may have a convex upper surface and function as a lens of the optical system 10.

The wiring board 40 is made of one of a rigid wiring board and a flexible substrate or a combination of the rigid wiring board and the flexible substrate. The wiring board 40 includes a plurality of first edge electrodes 42A (42A1 to 42A3) on a first main surface 40SA and a plurality of second edge electrodes 42B (42B1 to 42B3) on a second main surface 40SB. An electronic component 45 is mounted on the surface of the wiring board 40. In addition, electrode pads 43, to which a signal cable (not shown) is bonded, are disposed on a rear edge portion.

A side of the wiring board 40 comes into contact with the opposing surface 30SB of the image pickup device 30, and the first main surface 40SA and the second main surface 40SB are disposed in an upright state with respect to the opposing surface 30SB. The first convex electrodes 32A are bonded to the first edge electrodes 42A, and the second convex electrodes 32B are bonded to the second edge electrodes 42B. The wiring board 40 is held between the first convex electrodes 32A and the second convex electrodes 32B. Note that a width W40 of the wiring board 40 can be equal to or smaller than a width W30 of the image pickup device 30.

Figures 5A, 5B, 5C:
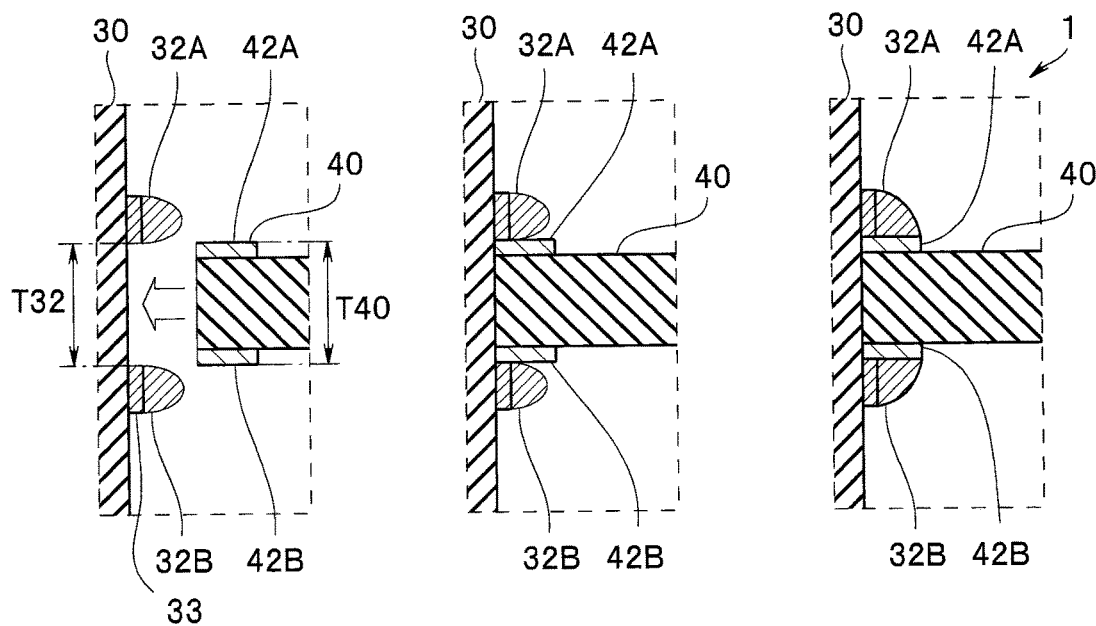
FIG. 5A is a partial cross-sectional view for describing a manufacturing method of the image pickup apparatus according to the embodiment.
FIG. 5B is a partial cross-sectional view for describing the manufacturing method of the image pickup apparatus according to the embodiment.
FIG. 5C is a partial cross-sectional view for describing the manufacturing method of the image pickup apparatus according to the embodiment.

Technically, the thickness T40 of the wiring board 40 is a thickness including the edge electrodes 42A and 42B as shown in FIG. 5A. The distance T32 between the first convex electrode 32A and the second convex electrode 32B does not have to be completely the same as the thickness T40 of the wiring board 40, and the distance T32 may be slightly smaller than the thickness T40 as long as the wiring board 40 can be held. For example, $0.95 \times T40 \leq T32 \leq T40$ holds.

As shown in FIG. 5B, the wiring board 40 is held between the first convex electrode 32A and the second convex electrode 32B. When, for example, the convex electrodes 32 made of solder melt, the convex electrodes 32 are bonded to the edge electrodes 42 as shown in FIG. 5C.

The image pickup device is connected to the wiring board 140 through the pattern film 150. Therefore, bonding reliability of the image pickup apparatus is not higher than bonding reliability of an image pickup apparatus in which the image pickup device and the wiring board are bonded without using another member between the image pickup device and the wiring board. In addition, the substrate is adhered to the image pickup device 130, and a length of the image pickup apparatus is extended by a thickness of the substrate. In addition, the pattern film 150 is disposed on an upper side of the image pickup device 130, and an external dimension of the image pickup apparatus is larger than the image pickup device.

In contrast, in the image pickup apparatus 1, the convex electrodes 32 of the image pickup device 30 and the edge electrodes 42 of the wiring board 40 are directly bonded. Therefore, bonding reliability of the image pickup apparatus 1 is high. In addition, the wiring board 40 is disposed to be upright with respect to the opposing surface 30SB of the image pickup device 30. Therefore, the electrode pads 43 and the signal cable can be easily bonded in the image pickup apparatus 1. Furthermore, the length of the image pickup apparatus 1 is shorter than the conventional image pickup device. In addition, the configuration of the wiring board 40 of the image pickup apparatus 1 is simpler than the wiring board 140 of the conventional image pickup device, and the wiring board 40 can be easily manufactured.

Particularly, when convex portions of the convex electrodes 32 are made of solder, the plurality of convex electrodes 32 and the plurality of edge electrodes 42 can be simultaneously and surely bonded just by heating the convex portions while the wiring board 40 is held.

For stable holding of the wiring board 40, it is preferable that the height of the convex electrodes 32 be 10 μm or more, particularly, 25 μm or more, including the thickness of the electrode pads 33. It is preferable that the height of the convex electrodes 32 be, for example, 200 μm or less from the viewpoint of manufacturing technology.

Note that for the stable holding of the wiring board 40, it is preferable that the number of convex electrodes 32 be four or more, particularly, six or more. When the number of electrically required convex electrodes 32 is small in the specifications of the image pickup device 30, the plurality of convex electrodes 32 may include dummy electrodes not connected to the light receiving section 31 or dummy electrodes with the same potential as other convex electrodes. In this case, it is obvious that dummy edge electrodes are also disposed on the wiring board 40.

For example, when the image pickup device 30 is a four-terminal type, it is preferable to dispose the convex electrodes 32A1 and 32B1 as dummy electrodes to provide six convex electrodes.

Modifications

Next, image pickup apparatuses according to modifications of the embodiment will be described. The image pickup apparatuses of the modifications are similar to the image pickup apparatus 1 of the embodiment and have the same advantageous effects. Therefore, the same reference signs are provided to the constituent elements with the same functions, and the description will not be repeated.

Modification 1

Figure 6:
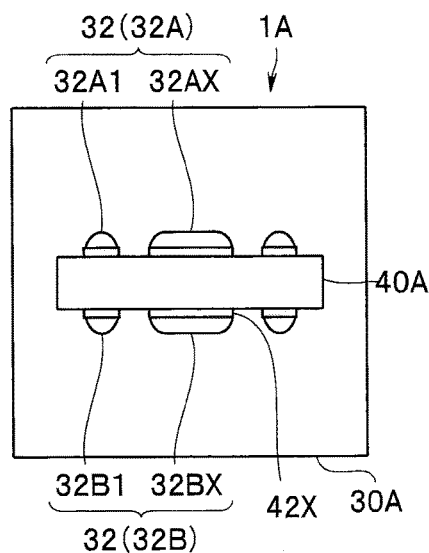
FIG. 6 is a schematic diagram of an image pickup apparatus observed from behind according to modification 1 of the embodiment.

As shown in FIG. 6, in an image pickup apparatus 1A of modification 1, the plurality of convex electrodes 32 of an image pickup device 30A include a plurality of convex electrodes 32AX and 32BX in a shape different from the convex electrodes 32A and the convex electrodes 32B.

Like the convex electrodes 32AX and 32BX, the shape of the convex electrodes 32 may be an elongated shape, such as a semi-circular shape, along an end side of the wiring board 40. That is, the plurality of convex electrodes 32 may include convex electrodes in different shapes. Note that it is obvious that a wiring board 40A is also provided with edge electrodes in an elongated shape according to the shape of the convex electrodes 32AX and 32BX.

Modifications 2 to 6

In image pickup apparatuses 1B to 1F of modifications 2 to 6, the wiring board includes a branch section including a third main surface 40SC and a fourth main surface 40SD orthogonal to the first main surface 40SA, and the cross-sectional shape is L-shaped, T-shaped, cross-shaped (X-shaped), angled-U-shaped, or U-shaped. The branch section includes third edge electrodes 42C on the third main surface 40SC and fourth edge electrodes 42D on the fourth main surface 40SD, and third convex electrodes 32C and fourth convex electrodes 32D are disposed on the opposing surface 30SB of the image pickup device. The third convex electrodes 32C are bonded to the third edge electrodes 42C, and the fourth convex electrodes 32D are bonded to the fourth edge electrodes 42D. The third convex electrodes 42C and the fourth convex electrodes 42D hold the branch section.

Figure 7:
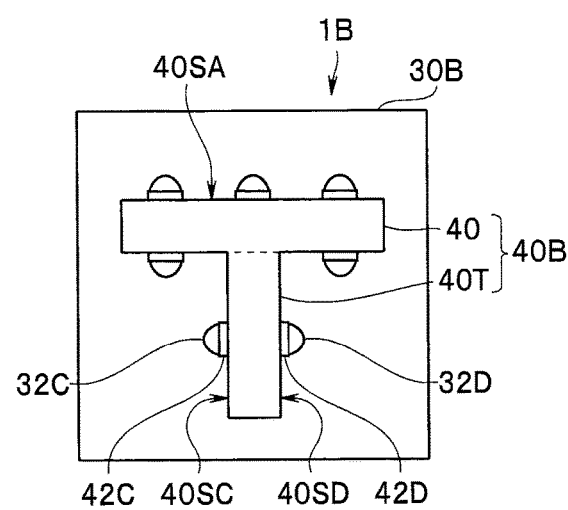
FIG. 7 is a schematic diagram of an image pickup apparatus observed from behind according to modification 2 of the embodiment.

For example, in the image pickup apparatus 1B of modification 2 shown in FIG. 7, a wiring board 40B has a T shape including a branch section 40T provided with the third main surface 40SC and the fourth main surface 40SD orthogonal to the first main surface 40SA. The third convex electrodes 32C are bonded to the third edge electrodes 42C, and the fourth convex electrodes 32D are bonded to the fourth edge electrodes 42D. The branch section 40T is held between the third convex electrodes 32C and the fourth convex electrodes 32D.

Figure 8:
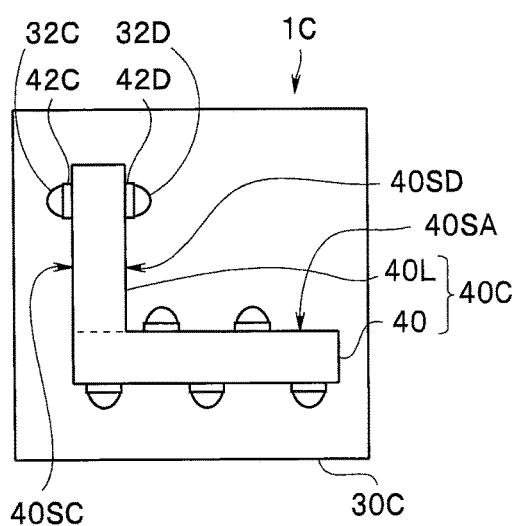
FIG. 8 is a schematic diagram of an image pickup apparatus observed from behind according to modification 3 of the embodiment.

In the image pickup apparatus 1C of modification 3 shown in FIG. 8, a wiring board 40C has an L shape including a branch section 40L provided with the third main surface 40SC and the fourth main surface 40SD orthogonal to the first main surface 40SA.

Note that as shown in FIG. 8, the distance T32 between the plurality of convex electrodes holding the wiring board may be arranged independently of the thickness T40 of the wiring board 40 as long as the wiring board 40 is held. That is, two convex electrodes holding the wiring board may not face each other across the wiring board 40. In addition, there may be a convex electrode without an opposing partner across the wiring board 40 as shown in FIG. 7.

Figure 9:
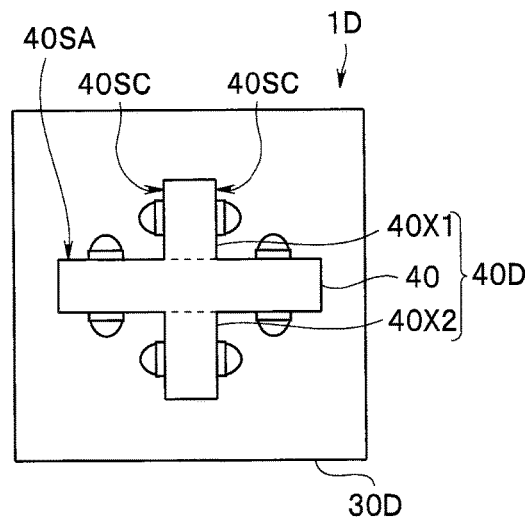
FIG. 9 is a schematic diagram of an image pickup apparatus observed from behind according to modification 4 of the embodiment.

In the image pickup apparatus 1D of modification 4 shown in FIG. 9, a wiring board 40D has an X shape including: a branch section 40X1 provided with the third main surface 40SC and the fourth main surface 40SD orthogonal to the first main surface 40SA; and a branch section 40X2 provided with a fifth main surface 40SE and a sixth main surface 40SF orthogonal to the first main surface 40SA.

Figure 10:
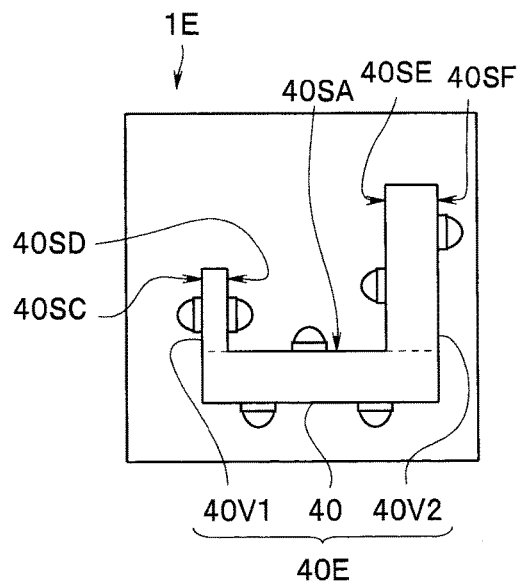
FIG. 10 is a schematic diagram of an image pickup apparatus observed from behind according to modification 5 of the embodiment.

In the image pickup apparatus 1E of modification 5 shown in FIG. 10, a wiring board 40E has a square-U shape including: a branch section 40V1 provided with the third main surface 40SC and the fourth main surface 40SD orthogonal to the first main surface 40SA; and a branch section 40V2 provided with the fifth main surface 40SE and the sixth main surface 40SF orthogonal to the first main surface 40SA.

Figure 11:
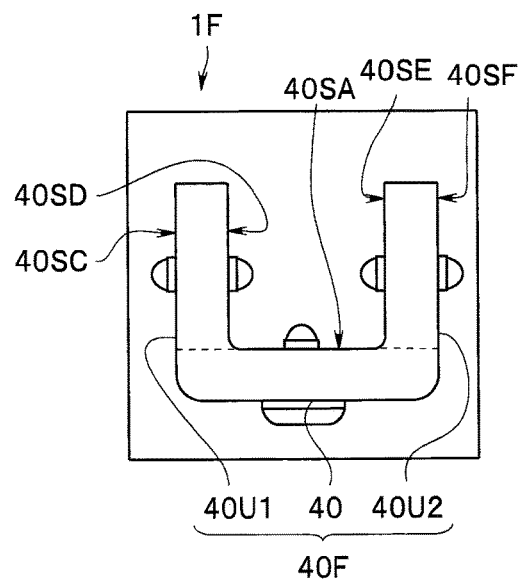
FIG. 11 is a schematic diagram of an image pickup apparatus observed from behind according to modification 6 of the embodiment.

In the image pickup apparatus 1F of modification 6 shown in FIG. 11, a wiring board 40F has a U shape including: a branch section 40U1 provided with the third main surface 40SC and the fourth main surface 40SD orthogonal to the first main surface 40SA; and a branch section 40U2 provided with the fifth main surface 40SE and the sixth main surface 40SF orthogonal to the first main surface 40SA.

In the image pickup apparatuses 1B to 1F of modifications 2 to 6, the image pickup device and the wiring board are more firmly bonded than in the image pickup apparatus 1 of the embodiment.

Modification 7

Figure 12:
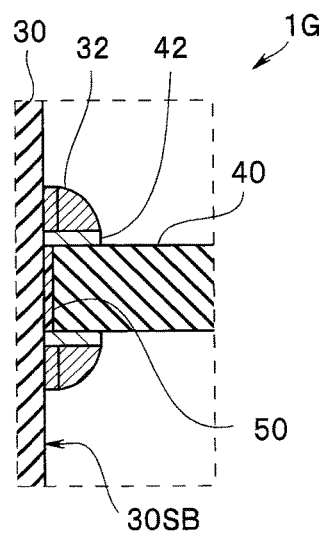
FIG. 12 is a partial cross-sectional view of an image pickup apparatus according to modification 7 of the embodiment.

As shown in FIG. 12, an image pickup apparatus 1G of modification 7 includes a heat transfer member 50 between the opposing surface 30SB of the image pickup device 30 and an end surface of the wiring board 40. The heat transfer member 50 is made of a resin containing powder with a high thermal conductivity in which the thermal conductivity is 0.1 W/(mK) or more, preferably, 5 W/(mK) or more.

In the image pickup apparatus 1G including the heat transfer member 50 between the opposing surface 30SB and the end surface of the wiring board 40 coming into contact with each other, the heat generated by the image pickup device 30 is efficiently transferred to the wiring board 40 through the insulating/sealing thin film formed on the opposing surface 30SB of the image pickup device 30. Therefore, the image pickup apparatus 1G is highly reliable.

Modification 8

Figure 13:
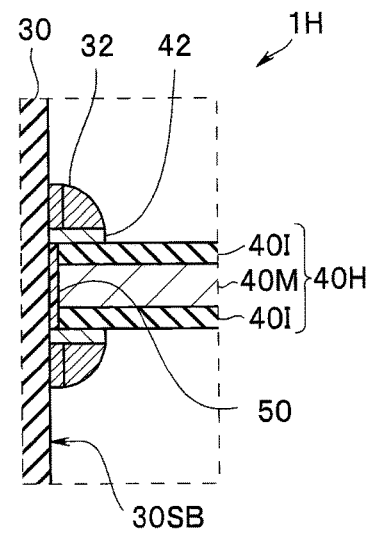
FIG. 13 is a partial cross-sectional view of an image pickup apparatus according to modification 8 of the embodiment.

As shown in FIG. 13, in an image pickup apparatus 1H of modification 8, a base material (core material) 40M of a wiring board 40H is made of a material with a high thermal conductivity in which the thermal conductivity is 10 W/(mK) or more, preferably, 20 W/(mK) or more.

For example, the base material 40M is made of metal, such as copper (398 W/(mK)) and aluminum (236 W/(mK)), and ceramics, such as alumina (20 W/(mK)), silicon carbide (200 W/(mK)), silicon nitride (27 W/(mK)), and aluminum nitride (170 W/(mK)).

When the base material 40M is a conductor, the wiring board 40H is provided with edge electrodes 42 and the like through insulating layers 40I made of polyimide or the like.

In the image pickup apparatus 1H, the wiring board 40 efficiently transfers the heat generated by the image pickup device 30. Therefore, the image pickup apparatus 1H is highly reliable.

Modification 9

Figure 14:
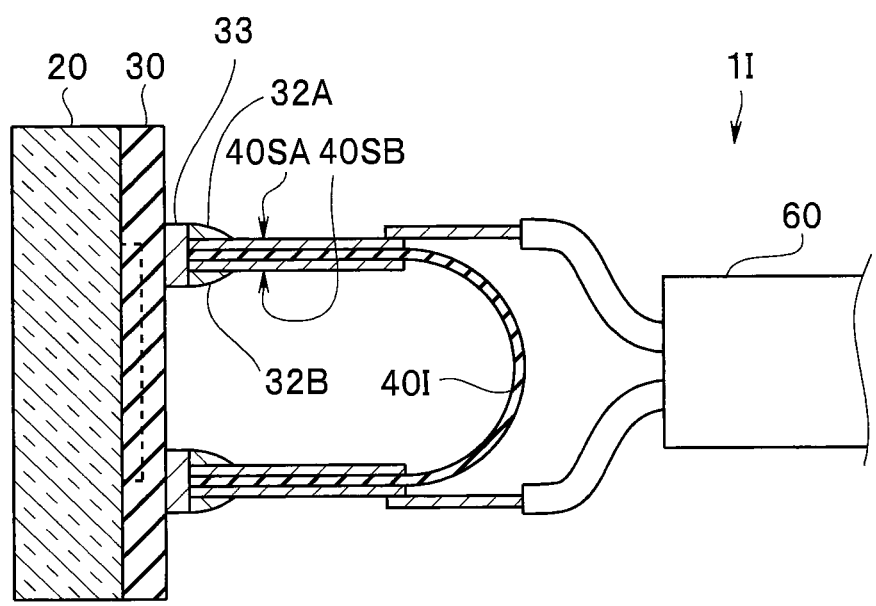
FIG. 14 is a cross-sectional view of an image pickup apparatus according to modification 9 of the embodiment.

As shown in FIG. 14, in an image pickup apparatus 1I of modification 9, both edge portions of a wiring board 40I are respectively held between the first convex electrodes 32A and the second convex electrodes 32B of the image pickup device 30. The first convex electrodes 32A and the second convex electrodes 32B are respectively disposed on the same electrode pads 33 and have the same potential. That is, the first convex electrodes 32A of the first main surface 40SA and the second convex electrodes 32B of the second main surface 40SB holding the wiring board 40I may be electrically connected.

A signal cable 60 is bonded to a rear section of the wiring board 40I. In the image pickup apparatus 1I, the flexible wiring board 40I is bent, and both edge portions are held between the convex electrodes. Therefore, the configuration is simple.

Note that the present invention is not limited to the embodiment described above and can be appropriately modified without opposing the gist or idea of the invention read form the scope of claims and the entire description, and the illumination device system accompanied by such a modification is also included in the technical scope of the present invention.

What is claimed is:

1. An image pickup apparatus comprising:
    an image pickup device comprising: a light receiving section configured to receive light entering from a light receiving surface; and a plurality of convex electrodes disposed on an opposing surface that faces the light receiving surface; and
    a wiring board comprising a plurality of first edge electrodes on a first main surface and a plurality of second edge electrodes on a second main surface,
    an insulating/sealing film disposed between the opposing surface of the image pickup device and an end surface of the wiring board, and
    a cover member fixed to the light receiving surface of the image pickup device,
    wherein the wiring board is disposed in an upright state on the opposing surface of the image pickup device,
    the plurality of convex electrodes comprise first convex electrodes and second convex electrodes,
    a height of the plurality of convex electrodes is 10 µm or more,
    the first convex electrodes are bonded to the first edge electrodes, the second convex electrodes are bonded to the second edge electrodes, and the wiring board is held between the first convex electrodes and the second convex electrodes;
    the wiring board comprises a branch section comprising a third main surface and a fourth main surface orthogonal to the first main surface, a cross-sectional shape of the wiring board is either L-shaped, T-shaped, X-shaped, angled-U-shaped, and U-shaped,
    the branch section comprises third edge electrodes on the third main surface and fourth edge electrodes on the fourth main surface, and
    third convex electrodes and fourth convex electrodes are disposed on the opposing surface of the image pickup device, the third convex electrodes are bonded to the third edge electrodes, the fourth convex electrodes are bonded to the fourth edge electrodes, and the branch section is held between the third convex electrodes and the fourth convex electrodes.

2. The image pickup apparatus according to claim 1, wherein the first convex electrodes and the second convex electrodes are configured by solder.

3. The image pickup apparatus according to claim 1, wherein
    an end surface of the wiring board comes into contact with the opposing surface of the image pickup device, and
    a thermal conductivity of a base material of the wiring board is 10 W/(mK) or more.

4. The image pickup apparatus according to claim 3, wherein a heat transfer member with a thermal conductivity of 0.1 W/(mK) or more is provided between the opposing surface of the image pickup device and the end surface of the wiring board.

5. The image pickup apparatus according to claim 1, wherein the plurality of convex electrodes comprise dummy electrodes not connected to the light receiving sections or dummy electrodes with a same potential as other convex electrodes.

6. An image pickup apparatus comprising:
    an image pickup device comprising: a light receiving section configured to receive light entering from a light receiving surface; and a plurality of convex electrodes disposed on an opposing surface that faces the light receiving surface; and
    a wiring board comprising a plurality of first edge electrodes on a first main surface and a plurality of second edge electrodes on a second main surface,
    wherein the wiring board is disposed in an upright state on the opposing surface of the image pickup device,
    the plurality of convex electrodes comprise first convex electrodes and second convex electrodes,
    a height of the plurality of convex electrodes is 10 µm or more,
    the first convex electrodes are bonded to the first edge electrodes, the second convex electrodes are bonded to the second edge electrodes, and the wiring board is held between the first convex electrodes and the second convex electrodes,
    the wiring board comprises a branch section comprising a third main surface and a fourth main surface orthogonal to the first main surface, a cross-sectional shape of the wiring board is either L-shaped, T-shaped, X-shaped, angled-U-shaped, and U-shaped,
    the branch section comprises third edge electrodes on the third main surface and fourth edge electrodes on the fourth main surface, and
    third convex electrodes and fourth convex electrodes are disposed on the opposing surface of the image pickup device, the third convex electrodes are bonded to the third edge electrodes, the fourth convex electrodes are bonded to the fourth edge electrodes, and the branch section is held between the third convex electrodes and the fourth convex electrodes.

* * * * *